US009299759B2

United States Patent
Park et al.

(10) Patent No.: US 9,299,759 B2
(45) Date of Patent: Mar. 29, 2016

(54) ORGANIC LIGHT-EMITTING DISPLAY DEVICE AND METHOD OF MANUFACTURING THE SAME

(71) Applicant: Samsung Display Co., LTD., Yongin-si, Gyeonggi-do (KR)

(72) Inventors: Sang-Il Park, Yongin (KR); Yeon-Gon Mo, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 41 days.

(21) Appl. No.: 14/083,049

(22) Filed: Nov. 18, 2013

(65) Prior Publication Data

US 2014/0231764 A1   Aug. 21, 2014

(30) Foreign Application Priority Data

Feb. 20, 2013 (KR) .................. 10-2013-0018239

(51) Int. Cl.
  *H01L 27/32* (2006.01)
  *H01L 51/56* (2006.01)
(52) U.S. Cl.
  CPC .................. *H01L 27/3276* (2013.01)
(58) Field of Classification Search
  CPC .............. H01L 27/32; H01L 51/56
  USPC .............. 257/40, 59, 72, 88; 438/23, 158
  See application file for complete search history.

(56) References Cited

U.S. PATENT DOCUMENTS

| 5,453,856 A | 9/1995 | Kim | |
| 7,026,649 B2* | 4/2006 | Kang et al. | 257/72 |
| 7,273,772 B2* | 9/2007 | Chang et al. | 438/149 |
| 2006/0269786 A1* | 11/2006 | Shin et al. | 428/690 |
| 2008/0158493 A1* | 7/2008 | Park | 349/139 |
| 2009/0072228 A1* | 3/2009 | Choi et al. | 257/40 |
| 2010/0025679 A1* | 2/2010 | Yamazaki et al. | 257/43 |

(Continued)

FOREIGN PATENT DOCUMENTS

| JP | 04338730 | 11/1992 |
| JP | 05119332 | 5/1993 |
| JP | 03808107 | 5/2006 |

(Continued)

OTHER PUBLICATIONS

Chen, et al., ITO-Ag alloy-ITO film with stable and high conductivity depending on the control of atomically flat interface, Materials Letters 61(19-20) : 4097-4099 (2007).

(Continued)

*Primary Examiner* — Sheng Zhu
(74) *Attorney, Agent, or Firm* — Robert E. Bushnell, Esq.

(57) ABSTRACT

Provided is an organic light-emitting display device that includes: a substrate; a first wiring that extends in a first direction on the substrate and comprises first and second portions with an opening therebetween; a second wiring that overlaps with the opening and extends in a second direction that crosses the first direction; an insulating film that covers the first wiring and the second wiring and comprises a first contact hole that exposes the first portion of the first wiring and a second contact hole that exposes the second portion; and a bridge electrode that is formed on the insulating film, is electrically connected to the first and second portions through the first and second contact holes, and comprises a transparent conductive oxide and a metal.

8 Claims, 7 Drawing Sheets

(56) References Cited

U.S. PATENT DOCUMENTS

2011/0090446 A1* 4/2011 Kim et al. ............. 349/139
2011/0140114 A1* 6/2011 Ko et al. ............. 257/59

FOREIGN PATENT DOCUMENTS

| KR | 1020020034271 A | 5/2002 |
| KR | 1020040060038 A | 7/2004 |
| KR | 1020080051220 A | 6/2008 |

OTHER PUBLICATIONS

Nomura, et al., Room temperature fabrication of transparent flexible thin-film transistors using amorphous oxide semiconductors, Nature 432(7016) : 488-492 (2004).

* cited by examiner

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application for ORGANIC LIGHT-EMITTING DISPLAY DEVICE AND METHOD OF MANUFACTURING THE SAME, earlier filed in the Korean Intellectual Property Office on Feb. 20, 2013, and there duly assigned Serial No. 10-2013-0018239.

BACKGROUND OF THE INVENTION

1. Field of the Invention

The present invention relates to an organic light-emitting display device and a method of manufacturing the same.

2. Description of the Related Art

In an active matrix form organic light-emitting display device, a plurality of gate lines and data lines are arranged in a matrix form to define each pixel. Each pixel includes a thin film transistor, a capacitor, and an organic light-emitting device connected to the thin film transistor and the capacitor. The organic light-emitting device generates light by receiving appropriate signals from the thin film transistor and the capacitor and thus realizes a desired image.

However, since the gate lines and data lines are arranged in a matrix form, always some portions of them overlap. The overlapping portions of the gate lines and data lines have a parasitic capacitance. The parasitic capacitance generated in this way causes difficulty in realizing an image having high resolution. There is a need to address this problem.

SUMMARY OF THE INVENTION

The present invention provides an organic light-emitting display device having a reduced parasitic capacitance that is generated on overlapping portions of wirings, and a method of manufacturing the same.

According to an embodiment of the present invention, there is provided an organic light-emitting display device including: a substrate; a first wiring that extends in a first direction on the substrate and includes first and second portions with an opening therebetween; a second wiring that overlaps with the opening and extends in a second direction that crosses the first direction; an insulating film that covers the first wiring and the second wiring, the insulating film comprising a first contact hole that exposes the first portion of the first wiring and a second contact hole that exposes the second portion; and a bridge electrode that is formed on the insulating film, is electrically connected to the first and second portions through the first and second contact holes, respectively, and comprises a transparent conductive oxide and a metal.

The organic light-emitting display device may further include a thin film transistor (TFT) that includes a gate electrode formed on the substrate, an active layer insulated from the gate electrode, a source electrode and a drain electrode formed on the active layer, the first wiring being formed at the same level as the gate electrode, the second wiring being formed at the same level as the source electrode and the drain electrode.

The organic light-emitting display device may further include a TFT that includes a gate electrode formed on the substrate, an active layer insulated from the gate electrode, a source electrode and a drain electrode formed on the active layer, the first wiring being formed at the same level as the source electrode and the drain electrode, the second wiring being formed at the same level as the gate electrode.

The active layer may include a semiconductor oxide.

The organic light-emitting display device may further include a pixel electrode that is formed on the insulating film and is connected to the TFT, an intermediate layer formed on the pixel electrode, and a facing electrode formed on the intermediate layer.

The organic light-emitting display device may further include a bus line that is formed on the same level as the bridge electrode using the same material used to form the bridge electrode, the bus line being connected to the facing electrode.

The organic light-emitting device may emit light from the intermediate layer in a direction towards the facing electrode.

The bridge electrode may include a first layer that includes indium tin oxide (ITO), a second layer that includes silver (Ag), and a third layer that includes ITO.

According to an embodiment of the present invention, there is provided a method of manufacturing an organic light-emitting display device, the method comprising: a first mask process for forming on a substrate a gate electrode and a first wiring that extends in a first direction, is connected to the gate electrode, and comprises first and second portions with an opening therebetween; a second mask process for forming an active layer corresponding to the gate electrode; a third mask process for forming an etch stopper film that comprises holes for exposing edges of the active layer; a fourth mask process for forming on the etch stopper film source and drain electrodes that contact the active layer through the holes and a second wiring that extends in a second direction crossing the first direction to overlap the opening; a fifth mask process for forming an insulating film that covers the source electrode, the drain electrode, and the second wiring and comprises a first contact hole that exposes the first portion, a second contact hole that exposes the second portion, and a via hole that exposes one of the source electrode and the drain electrode; and a sixth mask process for forming on the insulating film a pixel electrode that is connected to one of the source electrode and the drain electrode through the via hole, and a bridge electrode that electrically connects the first and second portions through the first and second contact holes and comprises a transparent conductive oxide and a metal.

The active layer may include a semiconductor oxide.

The method may further include a seventh mask process for forming a pixel defining film including an opening that exposes the pixel electrode on the insulating film.

The method may further include: forming an intermediate layer on the pixel electrode that is exposed through the opening; and forming a facing electrode covering the intermediate layer on the pixel defining film.

The sixth mask process may further include forming a bus line on the same level as the bridge electrode using the same material used to form the bridge electrode, and the seventh mask process may include forming the pixel defining film that further includes a hole that exposes the bus line, the facing electrode being electrically connected to the bus line.

The bridge electrode may include a first layer that includes ITO, a second layer that includes Ag, and a third layer that includes ITO.

According to another embodiment of the present invention, there is provided a method of manufacturing an organic light-emitting display device, the method comprising: a first mask process for forming on a substrate a gate electrode and a first wiring that is connected to the gate electrode and extends in a first direction; a second mask process for forming an active layer corresponding to the gate electrode; a third mask process for forming an etch stopper film that comprises holes for exposing edges of the active layer; a fourth mask process for forming on the etch stopper film source and drain electrodes that contact the active layer through the holes and for forming on the etch stopper film a second wiring that comprises an opening that overlaps with the first wiring, first and second portions of the second wiring being separated from each other with the opening being interposed therebetween, the second wiring extending in a second direction crossing the first direction; a fifth mask process for forming an insulating film that covers the source electrode, the drain electrode, and the second wiring, the insulating film comprising a first contact hole that exposes the first portion, a second contact hole that exposes the second portion, and a via hole that exposes one of the source electrode and the drain electrode; and a sixth mask process for forming on the insulating film a pixel electrode that is connected to one of the source electrode and the drain electrode through the via hole and for forming a bridge electrode that electrically connects the first and second portions through the first and second contact holes and comprises a transparent conductive oxide and a metal.

The active layer may include a semiconductor oxide.

The method may further include a seventh mask process for forming a pixel-defining film that includes an opening that exposes the pixel electrode on the insulating film.

The method may further include: forming an intermediate layer on the pixel electrode that is exposed through the opening; and forming a facing electrode covering the intermediate layer on the pixel-defining film.

The sixth mask process may further include forming a bus line at the same level as the bridge electrode using the same material used to form the bridge electrode, and the seventh mask process may further include forming a pixel-defining film that includes holes that expose the bus line, the facing electrode being electrically connected to the bus line.

The bridge electrode may include a first layer that includes ITO, a second layer that includes Ag, and a third layer that includes ITO.

As described above, according to the present invention, an opening is disposed on an overlapping portion of a single wiring, which is one of two overlapping wirings that cross each other, and the ends of the single wiring that is interrupted by the opening are electrically connected to each other using a bridge electrode. Therefore, parasitic capacitance at regions where wirings overlap is reduced. Accordingly, the organic light-emitting display device may realize a high resolution image.

According to the current invention, the bridge electrode may be formed at the same time as the pixel electrode is formed, and thus, an additional mask and process may not be necessary. Therefore, the manufacture of the organic light-emitting display device is efficient and economical.

BRIEF DESCRIPTION OF THE DRAWINGS

A more complete appreciation of the invention and many of the attendant advantages thereof will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
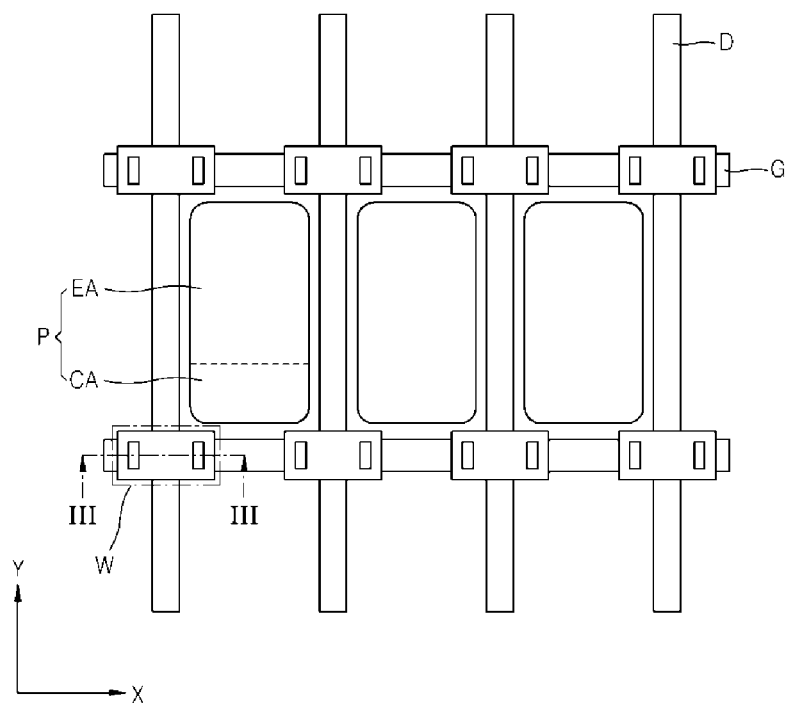
FIG. 1 is a schematic plan view of an organic light-emitting display device according to an embodiment of the present invention.

The present invention will now be described more fully with reference to the accompanying drawings, in which exemplary embodiments of the invention are shown.

In the drawings, in order for clear explanations, parts that are not related to the present invention are simply depicted or not depicted and are described simply or omitted. Also, thicknesses and areas of layers and regions may be exaggerated for clarity.

Like reference numerals are used to identify like elements throughout the specification. The terms 'first', 'second', 'third', etc., may be used in the specification to describe various elements, but these elements should not be limited by these terms. These terms are only used to distinguish one element from another. When a layer, a film, a region, or a panel is referred to as being "on" another element, it can be directly on the other layer or substrate, or intervening layers may also be present.

In the current specification, for convenience of explanation, a single thin film transistor (TFT), a single capacitor, and a single organic light-emitting device are depicted in a single pixel included in an organic light-emitting display device. However, the single pixel may further include a plurality of TFTs, a plurality of capacitors, and a plurality of organic light-emitting devices.

Figure 2:
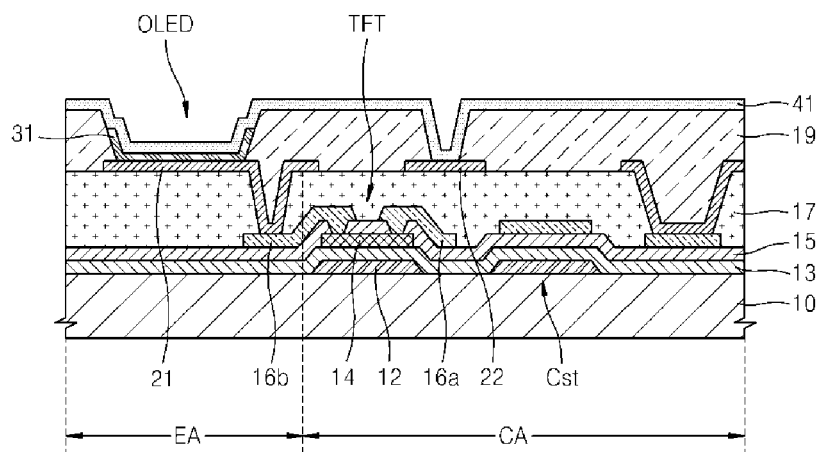
FIG. 2 is a detailed cross-sectional view of a pixel portion of FIG. 1.
Figure 3:
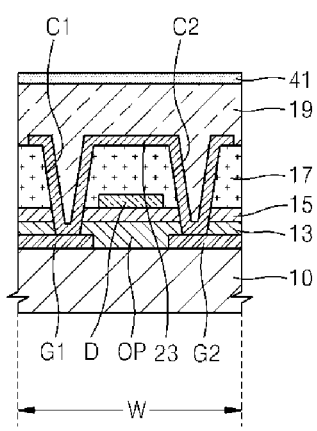
FIG. 3 is a cross-sectional view taken along line III-III of FIG. 1.

FIG. 1 is a schematic plan view of an organic light-emitting display device according to an embodiment of the present invention. FIG. 2 is a detailed cross-sectional view of a pixel portion of FIG. 1. FIG. 3 is a cross-sectional view taken along line III-III of FIG. 1.

Referring to FIG. 1, the organic light-emitting display device includes a first wiring extending in a first direction (an X direction) and a second wiring extending in a second direction (a Y direction) that crosses the first direction.

Hereinafter, the first wiring is a gate line G that applies a scan signal or a gate signal, and the second wiring is a data line D that applies a data signal. However, the first wiring and the second wiring according to the present invention are not limited thereto. That is, the first wiring may be any wiring formed on the same array as the gate line G, may be a control line that applies a control signal, or may be a power line that applies power. Also, the second wiring may be any wiring formed on the same layer as the data line D, may be a control line that applies a control signal, or may be a power line that applies power.

A pixel region P is defined by the gate line G and the data line D. The pixel region P is a region in the shape of a rectangle formed when the gate lines G and the data lines D cross each other in a matrix form.

Each pixel region P includes a light-emitting region EA and a circuit region CA.

Referring to FIG. 2, the circuit region CA is electrically connected to the data line D and the gate line G. The circuit region CA includes at least one thin film transistor (TFT) and at least one capacitor Cst. The circuit region CA is a region for driving an organic light-emitting device (OLED). In FIG. 2, a TFT that is connected to the OLED to drive the OLED is depicted.

The TFT is a bottom gate type transistor that includes a gate electrode 12, an active layer 14 insulated from the gate electrode 12, and a source electrode 16a and a drain electrode 16b that are connected to the active layer 14. The active layer 14 may include an oxide semiconductor. However, the TFT according to the embodiment of FIGS. 1-3 is not limited to the bottom gate type depicted in FIG. 2, and may be realized in various ways such as a top gate type TFT.

The capacitor Cst includes a lower electrode formed at the same level as the gate electrode 12 and an upper electrode formed at the same level as the source electrode 16a and the drain electrode 16b. In FIG. 2, the TFT and the capacitor Cst appear separated in the cross section chosen for view, but the TFT and the capacitor Cst are electrically connected.

The light-emitting region EA is a region where the OLED is disposed and light is emitted. The OLED is formed on a planarizing film 17 that covers the TFT and the capacitor Cst. The OLED includes a pixel electrode 21, an intermediate layer 31, and a facing electrode 41. The pixel electrode 21 is connected to, for example, the drain electrode 16b of the TFT. When the organic light-emitting display device is a top emission type in which light is emitted in a direction opposite to a substrate, the pixel electrode 21 is a reflective electrode. For example, the pixel electrode 21 may include a transparent conductive oxide and a metal, and may include a triple layer structure of indium tin oxide (ITO)/silver (Ag)/ITO.

In a crossing unit W, the data line D crosses the gate line G. At least one crossing unit W is disposed adjacent to each pixel region P.

Referring to FIG. 3, a bridge electrode 23 is disposed in the crossing unit W to reduce a parasitic capacitance. More specifically, the gate line G has an opening OP, the gate line G does not overlap with the data line D, and the edges of the gate line G that define the opening OP are referred to as a first portion G1 and a second portion G2. Throughout the whole substrate surface, the gate line G may include a plurality of openings OP. Since the data line D and the gate line G are disposed in a mesh type, the data line D and the gate line G have a plurality of crossing units W. Also, since the gate line G includes a plurality of openings OP, the gate line G includes a plurality of first and second portions G1 and G2.

The openings OP do not represent points of electrical disconnection of the gate line G because the bridge electrodes 23 electrically connect the first and second portions G1 and G2 of the gate line G. The bridge electrode 23 is formed on the planarizing film 17 that covers the data line D. The bridge electrode 23 is electrically connected to the first and second portions G1 and G2 of the gate line G respectively through first and second contact holes C1 and C2 formed in the planarizing film 17. The bridge electrode 23 may be formed at the same level as the pixel electrode 21 of the OLED using the same material used to form the pixel electrode 21. When the organic light-emitting display device is a top emission type, the bridge electrode 23 may include a transparent conductive oxide and a metal, for example, a triple layer structure of ITO/Ag/ITO.

According to the embodiment of FIGS. 1-3, the openings OP are formed in the gate line G of the crossing unit W, and the bridge electrode 23 that connects the disconnected ends within gate line G is formed on the planarizing film 17, and, thus, the parasitic capacitance of the crossing unit W may be reduced.

A charge capacity between the two conductors is determined by Equation 1. In Equation 1, C is charge capacitance, ∈ is dielectric constant, A is an area of an electrode, and d is a distance between the electrodes.

$$C = \varepsilon \frac{A}{d} \quad \text{[Equation 1]}$$

As a comparative example of the present invention, when the data line D and the gate line G overlap at the crossing unit W, the parasitic capacitance at the crossing unit W is determined as follows: The dielectric constant ∈ is substituted by dielectric constants of a gate insulating film 13 and an etch stopper film 15 between the data line D and the gate line G, d is substituted by a distance between the data line D and the gate line G, and A is substituted by areas of overlapping regions between the data line D and the gate line G. Thus, the parasitic capacitance according to the comparative example is calculated.

However, according to the embodiment of FIGS. 1-3, the parasitic capacitance of the crossing unit W is determined as follows: The dielectric constant ∈ is substituted by a dielectric constant of the planarizing film 17 between the data line D and the bridge electrode 23, d is substituted by a distance between the data line D and the bridge electrode 23, and A is substituted by areas of overlapping regions between the data line D and the bridge electrode 23, and thus, a parasitic capacitance according to the embodiment of FIGS. 1-3 is calculated.

Accordingly, according to the embodiment of FIGS. 1-3, since the planarizing film 17 has a thickness greater than the sum of thicknesses of the gate insulating film 13 and the etch stopper film 15, a distance d between the data line D and the bridge electrode 23 is greater than that in the comparative example, and thus, the parasitic capacitance is reduced in the embodiment of FIGS. 1-3.

FIGS. 4 through 10 are cross-sectional views illustrating a method of manufacturing the pixel portion of FIG. 2 and FIG. 3, according to an embodiment of the present invention. In FIGS. 4 through 10, an OLED included in the light emitting region EA, a TFT included in the circuit region CA, and a crossing unit W are depicted, and other constituent elements are omitted for convenience of explanation.

Figure 4:
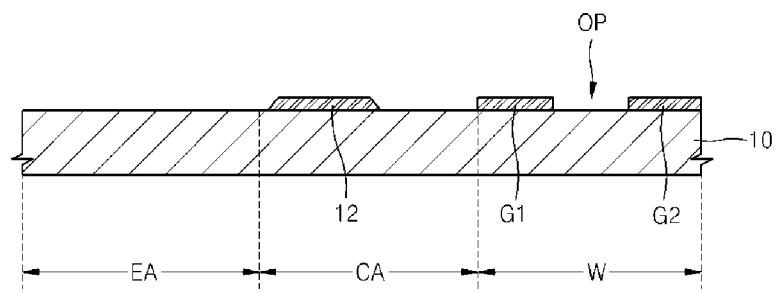
FIGS. 4 through 10 are cross-sectional views illustrating a method of manufacturing the pixel portion of FIG. 2 and FIG. 3, according to an embodiment of the present invention.

Referring to FIG. 4, a substrate 10 having a flat upper surface is prepared, and after optionally forming a buffer film (not shown) that prevents the penetration of foreign materials into the substrate 10, the gate electrode 12 and the gate line G are formed.

The gate electrode 12 and the gate line G may be formed such that, after forming a conductive layer (not shown) on the substrate 10, the conductive layer is patterned by using a first mask (not shown), the conductive layer being formed of a low resistance conductive material that includes at least one selected from the group consisting of Mo, Al, Pt, Pd, Au, Ti, and Cu.

An opening may be formed in the gate line G line at the crossing unit W. That is, the gate line G may include the first portion G1 and the second portion G2, and the first and second portions G1 and G2 may be separately disposed at the crossing unit W to define an opening OP.

Figure 5:
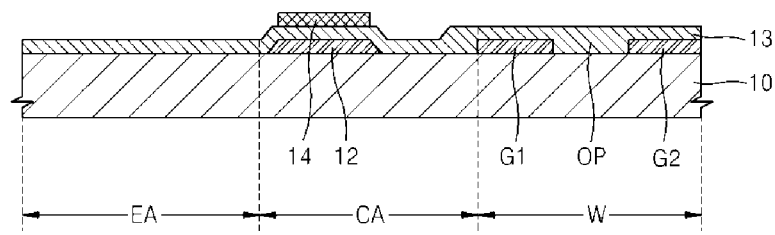

Referring to FIG. 5, the gate insulating film 13 may be formed on the gate electrode 12 and the gate line G. The gate insulating film 13 may include an inorganic material that includes at least one of silicon nitride SiNx and silicon oxide SiOx.

After forming a semiconductor layer (not shown) on the gate insulating film 13 to correspond to the gate electrode 12, the active layer 14 may be formed by a patterning process using a second mask (not shown). Here, the active layer 14 may include an oxide semiconductor. For example, the active layer 14 may include an a($In_2O_3$)b($Ga_2O_3$)c(ZnO) (G-I—Z—O) layer where a, b, and c are real numbers that respectively satisfy conditions of a≥0, b≥0, and c>0. Besides the materials above, the active layer 14 may include an oxide selected from the group consisting of Zn, In, Ga, Sn, Cd, Ge, Hf, and a combination of these materials.

Figure 6:
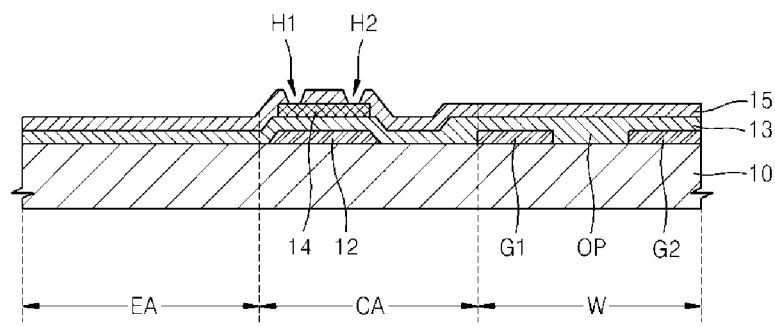

Referring to FIG. 6, the etch stopper film 15 may be formed on the gate insulating film 13. The etch stopper film 15 may be formed such that, after forming an insulating film (not shown) covering the active layer 14 on the gate insulating film 13, holes H1 and H2 may be formed in portions of the insulating film corresponding to edges of the active layer 14 by a patterning process using a third mask (not shown), the insulating film being formed of an inorganic material that may include at least one of silicon nitride SiNx and silicon oxide SiOx. The etch stopper film 15 may prevent damage to the active layer 14 when the source electrode 16a and the drain electrode 16b are formed by patterning.

Figure 7:
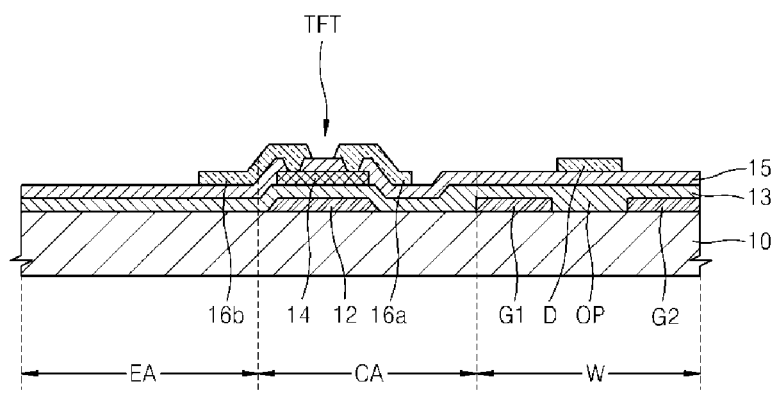

Referring to FIG. 7, the source electrode 16a, the drain electrode 16b, and the data line D may be formed on the active layer 14 and the etch stopper film 15. First, after forming a conductive layer (not shown) that fills the holes H1 and H2 of the etch stopper film 15, the source and drain electrodes 16a and 16b corresponding to the active layer 14, and the data line D connected to one of the source electrode 16a and the drain electrode 16b may be formed by patterning the conductive layer using a fourth mask (not shown).

The data line D may overlap with the opening OP of the gate line G at the crossing unit W. That is, the data line D may overlap only with the opening OP, and not with the gate line G. Accordingly, a parasitic capacitance is not generated between the data line D and the gate line G.

Figure 8:
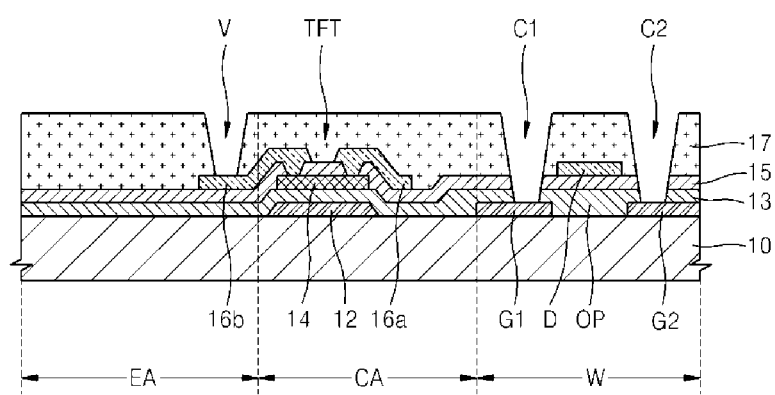

Referring to FIG. 8, the planarizing film 17 may be formed as shown. That is, after forming an insulating film (not shown) covering the source electrode 16a, the drain electrode 16b, and the data line D on the etch stopper film 15, the planarizing film 17 may be formed by patterning the insulating film (not shown) using a fifth mask (not shown) to have a via hole V that exposes one of the source electrode 16a and the drain electrode 16b and first and second contact holes C1 and C2 that respectively expose the first and second portions G1 and G2. At this point, the first and second contact holes C1 and C2 may also be formed in the etch stopper film 15 and the gate insulating film 13 to expose the first and second portions G1 and G2. The planarizing film 17 may be formed of an inorganic material or an organic material, for example, polyimide. The planarizing film 17 may have a thickness greater than the sum of thicknesses of the gate insulating film 13 and the etch stopper film 15. The planarizing film 17 may have a thickness of a few micrometers, for example, in a range from about 3 μm to about 5 μm.

Figure 9:
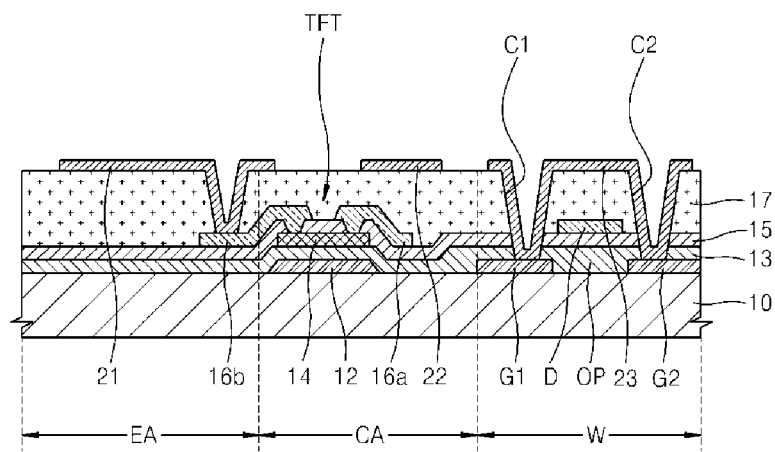

Referring to FIG. 9, the pixel electrode 21, a bus line 22, and the bridge electrode 23 may be formed as shown. First, a conductive layer (not shown) that fills the via hole V, the first contact hole C1, and the second contact hole C2 may be formed on the planarizing film 17. The conductive layer may include a transparent conductive oxide and a metal. For example, the conductive layer may be formed of a triple layer structure of ITO/Ag/ITO. The pixel electrode 21 connected to one of the source electrode 16a and the drain electrode 16b through the via hole V may be formed in the light-emitting region EA by patterning the conductive layer using a sixth mask (not shown). Also, the bridge electrode 23 that electrically connects the first and second portions G1 and G2 of the gate line G may be formed in the crossing unit W. Also, the bus line 22, which will be described below, may be formed as shown. The bus line 22 may receive power from the outside and transmit the power to the facing electrode 41 (see FIG. 2).

The bridge electrode 23 may connect the ends G1 and G2 of gate line G at the positions where gate line G is interrupted by the openings OP. The bridge electrode 23 may overlap with the data line D at the crossing unit W. Accordingly, a parasitic capacitance may be generated between the bridge electrode 23 and the data line D, but since the planarizing film 17 between the bridge electrode 23 and the data line D has a large thickness, the magnitude of the parasitic capacitance is not large. Also, since a conductive layer may be formed as a triple layer structure of ITO/Ag/ITO, the pixel electrode 21, the bridge electrode 23, and the bus line 22 may respectively include a first layer that includes ITO, a second layer that includes Ag, and a third layer that includes ITO.

Figure 10:
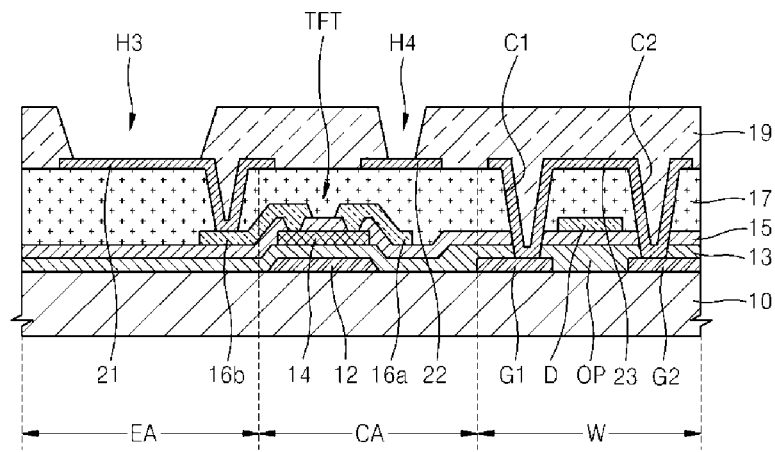

Referring to FIG. 10, a pixel-defining film 19 may be formed as shown. First, an insulating film (not shown) covering the pixel electrode 21, the bus line 22, and the bridge electrode 23 may be formed, and the pixel-defining film 19 may be formed to have an opening H3 that exposes a central region of the pixel electrode 21 and an opening H4 that exposes the bus line 22. Thus, the opening H3 may define the light-emitting region EA.

Next, referring to FIG. 2, the intermediate layer 31 may be formed on the pixel electrode 21, which is exposed through the opening H3. The intermediate layer 31 may include an organic light-emitting layer that emits red, green, and blue light. The organic light-emitting layer may be formed of a low molecular weight organic material or a polymer organic material. When the organic light-emitting layer is formed of a low molecular weight organic material, a hole transport layer (HTL) and a hole injection layer (HIL) may be located sequentially in a direction towards the pixel electrode 21, and an electron transport layer (ETL) and an electron injection layer (EIL) may be stacked in a direction towards the facing electrode 41, with respect to the organic light-emitting layer. Also, various layers besides the HTL, the HIL, the ETL, and the EIL may be stacked.

In the embodiment described above, an additional organic light-emitting layer is formed in each pixel. In this case, each pixel may emit red, green, and blue light, and a pixel group that emits red, green, and blue light may form a single unit pixel. However, the present invention is not limited thereto, and the organic light-emitting layer may be commonly formed in all of the pixels. For example, white light may be emitted by stacking or combining a plurality of organic light-emitting layers that emit red, green, and blue light. The combination of colors for emitting white light is not limited to the above descriptions. In this case, a color changing layer or a color filter may be additionally included to change the white light to a predetermined light color.

The facing electrode 41 facing the pixel electrode 21 may be formed on the intermediate layer 31. When the organic light-emitting display device is a top emission type, the facing electrode 41 may be formed as a semi-transparent electrode, for example, may be a thin film formed of at least one material selected from the group consisting of Li, Ca, LiF/Ca, LiF/Al, Al, Mg, and Ag. Also, the facing electrode 41 may be formed by including a material selected from the group consisting of ITO, IZO, ZnO, and $In_2O_3$. The facing electrode 41 may form a common electrode that is not patterned in each pixel.

Since the facing electrode 41 may include a thin film metal or a transparent metal oxide, the facing electrode 41 may have a large surface resistance when the facing electrode 41 is formed as a common electrode, and thus, a voltage drop (IR drop) may occur. To address this problem, the facing electrode 41 may be electrically connected to the bus line 22 through the opening H4. Also, since power is received from the bus line 22, the voltage drop problem may be removed.

Figure 11:
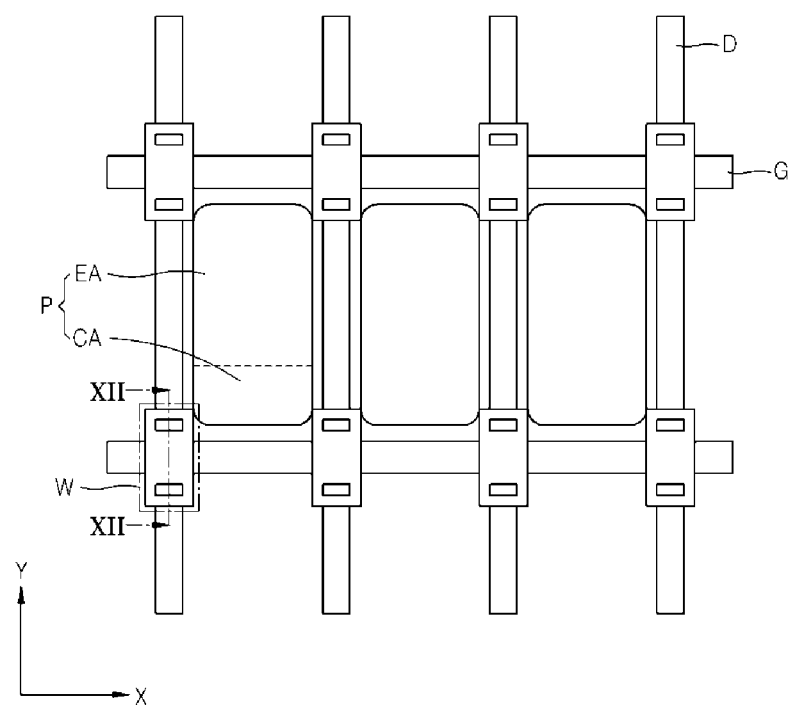
FIG. 11 is a schematic plan view of an organic light-emitting display device according to another embodiment of the present invention.
Figure 12:
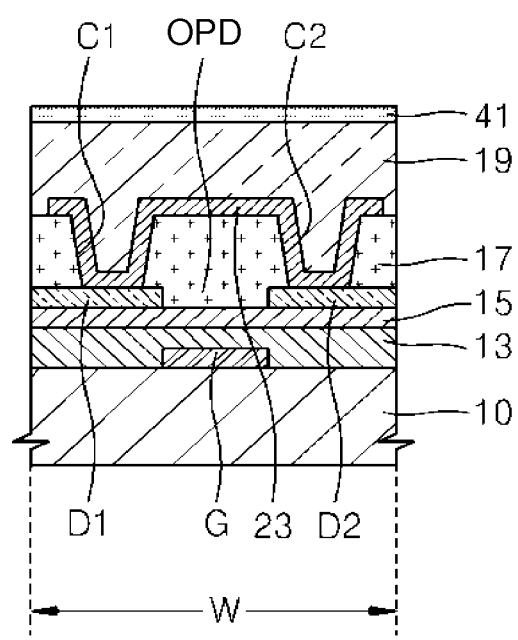
FIG. 12 is a cross-sectional view taken along line XII-XII of FIG. 11.

FIG. 11 is a schematic plan view of an organic light-emitting display device according to another embodiment of the present invention, and FIG. 12 is a cross-sectional view taken along line XII-XII of FIG. 11.

The organic light-emitting display device according to the embodiment depicted in FIGS. 11 and 12 has a difference from the organic light-emitting display device depicted in FIGS. 1 through 3 in that openings OP are formed by cutting a data line D at crossing units W. Hereinafter, the main differences between the two organic light-emitting display devices will be described.

Referring to FIGS. 11 and 12, after selectively forming a buffer film (not shown) on a substrate 10, a gate electrode 12 and a gate line G may be formed by a mask process using a first mask (not shown). At this point, a difference from the previous embodiment is that the gate line G does not have openings OP.

Next, the process of forming the active layer 14 by a second mask process after forming the gate insulating film 13 covering the gate electrode 12 and the gate line G and the process of forming by a third mask process the etch stopper film 15 including holes that expose edges of the active layer 14 are the same as those of the previous embodiment.

Afterwards, a source electrode 16a, a drain electrode 16b, and a data line D may be formed by a fourth mask process. At this point, an opening may be formed in the data line D at the crossing unit W. That is, the data line D may include a first portion D1 and a second portion D2, and the opening OPD is defined by separately forming the first and second portions D1 and D2.

Accordingly, the gate line G may overlap with the opening OPD of the data line D at the crossing unit W. That is, gate line G overlaps only with the opening OPD and does not overlap with the data line D. Accordingly, a parasitic capacitance is not generated between the data line D and the gate line G.

Next, a via hole, a first contact hole C1, and a second contact hole C2 may be formed in the planarizing film 17 by a fifth mask process, and a pixel electrode 21, a bus line 22, and a bridge electrode 23 may be formed by a sixth mask process. At this point, the bridge electrode 23 may connect the ends D1 and D2 of data line D at the position where data line D was interrupted by the opening OPD. The bridge electrode 23 may overlap with the gate line G at the crossing unit W. Accordingly, a parasitic capacitance may be generated between the bridge electrode 23 and the gate line G. However, the magnitude of the parasitic capacitance is small because the planarizing film 17 has a large thickness and the gate insulating film 13 and the etch stopper film 15 are disposed between the bridge electrode 23 and the data line D.

The processes of forming a pixel-defining film 19 by a seventh mask process and forming an intermediate layer 31 and a facing electrode 41 are the same as those in the previous embodiment, and, thus, repeated descriptions thereof are not provided.

The above descriptions are made mainly with regard to a top emission type organic light-emitting display device, but the present invention is not limited thereto. That is, the present invention may be applied to a bottom emission type organic light-emitting display device in which an image is realized by an observer positioned on the substrate side of the device, the image being formed from light propagated in a direction from intermediate layer 31 towards the substrate 10. The present invention may also be applied to a dual-side emission type organic light-emitting display device in which images are realized by observers positioned on either side of the device, the images being carried in both directions by light emitted by intermediate layer 31.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. An organic light-emitting display device comprising:
a substrate;
a first wiring that extends in a first direction on the substrate, and comprises first and second portions with an opening therebetween, the opening being entirely filled by a first insulating film;
a second wiring that overlaps with the opening and extends in a second direction that crosses the first direction;
a second insulating film that covers the first wiring and the second wiring, the second insulating film comprising
a first contact hole that exposes the first portion of the first wiring and
a second contact hole that exposes the second portion; and
a bridge electrode that is formed on the second insulating film, is electrically connected to the first and second portions through the first and second contact holes, respectively, and comprises a transparent conductive oxide and a metal, and wherein a distance between the substrate and the first wiring is shorter than a distance between the substrate and the second wiring.

2. The organic light-emitting display device of claim 1, further comprising a thin film transistor (TFT) that comprises
a gate electrode formed on the substrate,
an active layer insulated from the gate electrode,
a source electrode and a drain electrode formed on the active layer,
the first wiring formed at a same level as the gate electrode,
the second wiring formed at a same level as the source electrode and the drain electrode.

3. The organic light-emitting display device of claim 2, the active layer comprising a semiconductive oxide.

4. The organic light-emitting display device of claim 2, further comprising
a pixel electrode formed on the second insulating film and connected to the TFT,
an intermediate layer formed on the pixel electrode, and
a facing electrode formed on the intermediate layer.

5. The organic light-emitting display device of claim 4, further comprising a bus line comprised of same material of the bridge electrode, formed at a same level as the bridge electrode, and connected to the facing electrode.

6. The organic light-emitting display device of claim 4, the organic light-emitting device emitting light from the intermediate layer towards the facing electrode.

7. The organic light-emitting display device of claim 1, further comprising a TFT that comprises
a gate electrode formed on the substrate,
an active layer insulated from the gate electrode,
a source electrode and a drain electrode formed on the active layer,
the first wiring formed at a same level as the source electrode and the drain electrode, and the second wiring formed at a same level as the gate electrode.

8. The organic light-emitting display device of claim 1, the bridge electrode comprising:
   a first layer comprising indium tin oxide (ITO),
   a second layer comprising silver (Ag), and
   a third layer comprising ITO.

\* \* \* \* \*